United States Patent [19]

DiMarzio

[11] 4,339,011
[45] Jul. 13, 1982

[54] NON-DEFLECTION PRESSURE SWITCH APPARATUS

[75] Inventor: Alfred W. DiMarzio, Bethany, Conn.

[73] Assignee: General Electric Company, New York, N.Y.

[21] Appl. No.: 209,750

[22] Filed: Nov. 24, 1980

[51] Int. Cl.³ ............................................. G01G 23/18
[52] U.S. Cl. ............................. 177/177; 177/DIG. 3;
200/181; 307/273; 310/338
[58] Field of Search ............. 177/210 R, 210 FP, 177,
177/178, DIG. 3; 340/365 A; 310/319, 338;
315/55; 200/181; 307/273, 292

[56] References Cited

U.S. PATENT DOCUMENTS

| | | | |
|---|---|---|---|
| 3,076,903 | 2/1963 | Schwartz | 310/8.3 |
| 3,339,104 | 8/1967 | Kushner | 310/319 X |
| 3,480,801 | 11/1969 | Smith | 307/273 X |
| 3,532,993 | 10/1970 | Kennedy | 307/273 X |
| 3,853,191 | 12/1974 | Yamagiwa | 177/210 R |
| 3,899,698 | 8/1975 | Kleinschmidt | 310/9.5 |
| 3,940,637 | 2/1976 | Ohigashi et al. | 310/8.5 |
| 4,158,117 | 6/1979 | Quilliam et al. | 200/181 |
| 4,173,263 | 11/1979 | Meeks | 177/210 EM |

Primary Examiner—Joseph W. Hartary
Attorney, Agent, or Firm—George R. Powers; Leonard J. Platt; John F. Cullen

[57] ABSTRACT

A piezoelectric element is arranged to receive a mechanical pressure signal and to generate a resultant voltage which is connected to a voltage threshold device for detecting a voltage signal above a predetermined threshold value. The threshold device comprises a two state circuit operable to change state in response to a signal above the voltage threshold. The apparatus is especially adapted to be incorporated within a platform scale for energizing a scale reading indicating system.

8 Claims, 9 Drawing Figures

NON-DEFLECTION PRESSURE SWITCH APPARATUS

BACKGROUND OF THE INVENTION

1. Field of the Invention

The invention relates to an electrical switch apparatus employing a piezoelectric element to detect a mechanical pressure signal, and using the resultant voltage generated by that element to accomplish a switching function. The apparatus operates without any appreciable mechanical deflection and the invention is particularly adapted for and particularly useful in platform scales for the energization of a scale reading indicating system. In particular, it is especially useful in platform scales which operate with a very low deflection in the weight measurement system such as the scale described and claimed in a concurrently filed copending U.S. patent application Ser. No. 209,740 (6HW-5466) filed by Michael J. Ostrelich for "Thick Film Resistor Force Transducers and Weighing Scales" and assigned to the same assignee as the present application. The present invention was conceived for incorporation into a platform scale of the above description, and in one aspect, the invention may be considered as combined into such a scale. Platform scales of the above description are often used as and are referred to as household bathroom scales.

2. Description of the Prior Art

Such scales, as currently in production, are often provided with an electrically energized indicating system such as a lamp which illuminates a dial, or preferably such as light-emitting diode numerals in a digital scale. A scale of the latter type is exemplified, for instance, by the disclosure of U.S. Pat. No. 4,173,263 entitled "Digital Weighing Scale", invented by Frederick T. Meeks. The patent issued Nov. 6, 1979 and is assigned to the General Electric Company. As disclosed in that patent, a known method for energizing the electrical indicating system is to provide a mechanical snap-action switch which is mechanically arranged in parallel with the weighing mechanism, the switch being held open by the return springs of the weighing mechanism, and being released to the switch-closed position by the deflection and compression of the scale weighing mechanism when a weight is applied to be measured. One important problem with that arrangement is that the spring force of the switch is not totally released until the scale measures between 25 and 30 pounds. This means that the lower range of scale readings, below the point where the switch is completely released, is out of calibration, and does not read accurately. Accordingly, the weight of a small child cannnot be measured accurately. Furthermore, it is believed to be very desirable to users of bathroom scales to provide scale mechanisms having a minimum deflection, because the scale has a more solid feel. Such scales have many advantages, including compactness, and greater ease of shipment without damage. Accordingly, an effort is being made to produce platform scales having a very small total deflection of the weighing mechanism. The scale described in the above mentioned copending U.S. patent application filed by Ostrelich is such a scale.

In such scales, the total deflection of the weighing mechanism may not be sufficient to actuate the mechanical indicator switch, or so much of the deflection range of the weighing mechanism may be taken up with the deflection needed to operate the switch that virtually the entire range is made to be inaccurate by the spring force of the switch.

SUMMARY OF THE INVENTION

It is an object of the present invention to provide an improved electrical switch apparatus which requires virtually no mechanical deflection for actuation of the switch.

Another object of the invention is to provide an improved substantially non-deflection switch apparatus which is especially adapted for incorporation in a household bathroom scale for energization of the associated measurement indicating system.

Another important object of the invention is to provide an extremely fast acting switch apparatus for incorporation in a household bathroom scale which permits the switching on of a zero correction circuit and the storage of a zero reading from the scale weighing transducer before the transducer begins to register the weight to be weighed, in accordance with the teachings of copending U.S. patent application Ser. No. 209,751 filed concurrently with the present application by Harold W. Tomlinson, Jr. for "Weighing Scale with Dynamic Zero Error Correction" now U.S. Pat. No. 4,313,510.

Further objects and advantages of the invention will be apparent from the following description and the accompanying drawings.

In carrying out the invention, there is provided an electrical switch apparatus comprising a piezoelectric element positioned and arranged to receive a mechanical pressure signal and to generate a voltage in response thereto, an electrical voltage threshold device operable to detect a mechanical pressure signal sufficient to cause said piezoelectric element to generate a voltage above the voltage threshold of said threshold device, said threshold device comprising a two-state circuit operable from a first state to a second state in response to a signal above the voltage threshold.

In accordance with further aspects of the invention, the two-state circuit is coupled to an electrically energized weight indicating means which includes means providing a plurality of distinct signals indicating in combination the magnitude of a weight applied to the scale. The weight indicating means is deenergized when the two-state circut is in its first state and energized when the two-state circuit is in its second state. A time delay circuit is coupled to the two-state circuit and the weight indicating means for causing the two-state circuit to switch from its second state to its first state after a predetermined delay period. The delay circuit is responsive to the distinct signals such that the delay period runs only when the distinct signals indicate that the applied weight is less than a predetermined level.

Pressure-actuated piezoelectric transducers have been previously known, as shown in U.S. Pat. No. 3,076,903—Schwartz, 3,899,698—Kleinschmidt, 3,940,637—Ohigashi et al, and 4,158,117—Quilliam et al. However, all of these prior devices appear to rely upon a considerable strain or deflection of the piezoelectric device, and none of them seem to be combined with a threshold device which comprises a two-state circuit, in accordance with the present invention. Furthermore, none of them discloses the combination of such apparatus within a weighing scale appliance.

DESCRIPTION OF THE PREFERRED EMBODIMENTS

Figure 1:
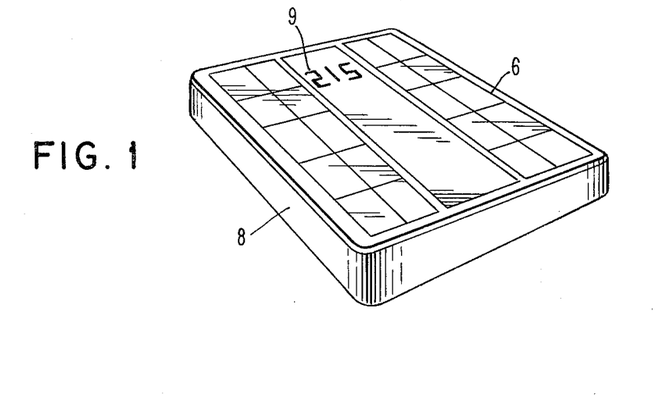
FIG. 1 is a perspective view of a household bathroom scale of the type which is intended to incorporate the present invention.

Referring to FIG. 1 of the drawings, there is shown a low profile bathroom scale which is of the general kind in which the present invention is intended to be combined for the purpose of switching on the scale indicating system. The scale includes a weight-supporting platform or cover 6, which has skirt portions 8 which completely surround and cover the scale mechanism. The cover 6 has an appropriate window through which digital readout elements are clearly visible to the user, as indicated at 9. These readout elements may be light-emitting diode numerical display devices. The weighing mechanism within the scale may be carried out in accordance with the teachings of the prior U.S. Pat. No. 4,173,263, previously mentioned above.

Figures 2, 2A:
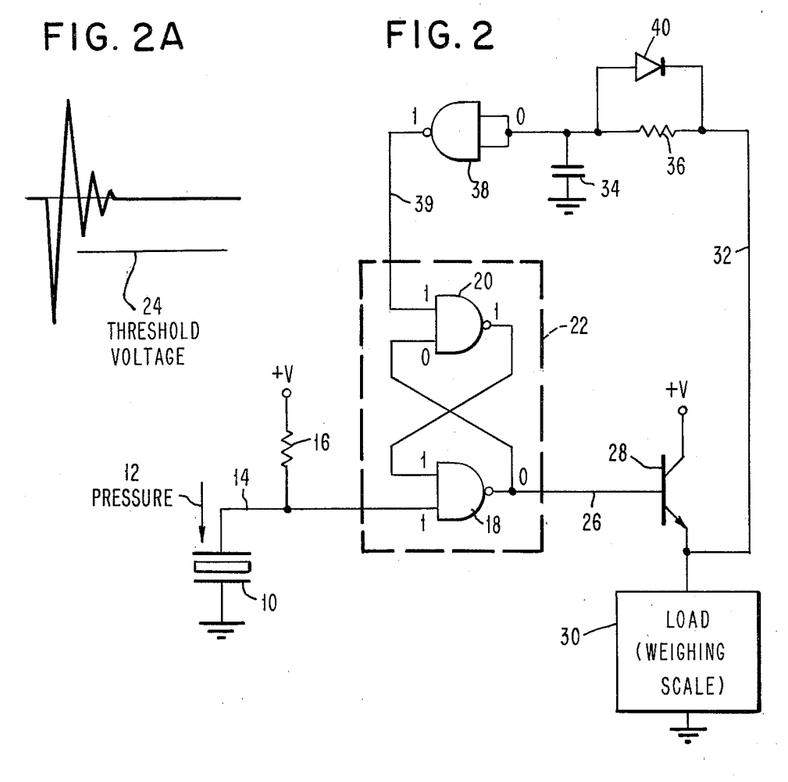
FIG. 2 is a schematic circuit diagram of a preferred embodiment of the invention.
FIG. 2A is an idealized representation of a voltage wave output from the piezoelectric device 10 of FIG. 2 when subjected to a pressure signal, and useful in explaining the operation of the circuit.

The switch apparatus of the present invention, which is preferably incorporated in the scale of FIG. 1, is shown in detail in FIG. 2 in schematic form. In FIG. 2 there is shown a piezoelectric device 10 which is intended to be subjected to a pressure signal as indicated by the arrow 12, as when it is employed as a sensing device within the weighing scale of FIG. 1. In response to the mechanical pressure signal, the piezoelectric device emits a voltage which is detectable at the upper terminal thereof, indicated at 14 in the circuit. The voltage typically emitted by the device 10 in response to the pressure signal is illustrated schematically in FIG. 2A wherein it is shown as an oscillating voltage wave which rapidly decreases in amplitude. Terminal 14 is normally biased with a positive voltage supplied from a terminal marked +V through a resistor 16. Terminal 14 is also connected as one of the inputs to a NAND gate 18, one of two NAND gates 18 and 20 forming an R-S type flip-flop 22. The bias voltage supplied through resistor 16 normally provides a positive bias on that input of NAND gate 18 (a logic 1 signal state). This serves to maintain the flip-flop 22 in a first state in which NAND gate 18 provides a logic 0 output, and NAND gate 20 provides a logic 1 output. As shown in the drawing, the NAND gates are cross-connected to provide the flip-flop function. Thus, the output of each NAND gate is supplied as one of the inputs to the other NAND gate.

The NAND gates operate in the usual NAND gate mode in which two logic 1 inputs result in a logic 0 output, and any other input condition results in a logic 1 output.

When the pressure signal voltage illustrated in FIG. 2A is available, the initial negative voltage swings of that voltage exceed a threshold value indicated at 24 in FIG. 2A which is determined by the positive voltage bias supplied through resistor 16. Thus, when the negative voltage swing is sufficient to substantially offset the normal positive bias, the threshold voltage value is reached at which the input from terminal 14 to NAND gate 18 achieves a logic 0 state. When that state is achieved, the flip-flop 22 shifts from the first state, indicated by the logic inputs and outputs shown in FIG. 2, to a second state in which the conditions of the NAND gates 18 and 22 are substantially reversed. That is, NAND gate 18 has a logic 0 input and a logic 1 output, NAND gate 22 has two logic 1 inputs, and a logic 0 output, and the logic 0 output from NAND gate 20 is carried across to provide a logic 0 input to NAND gate 18 to thus maintain the NAND gate 18 in the logic 1 output state, even though the signal at terminal 14 returns to a logic 1 value as the piezoelectric device voltage decays.

The resultant logic 1 output signal voltage from NAND gate 18 is carried through an output connection 26 to the control base electrode of the gating amplifier type NPN transistor device 28, to thus switch on the device 28 and to provide power to a load device 30. In the preferred embodiment, the load device 30 is at least the electrical indicating circuit of a weighing scale. The switching on of the transistor 28 also provides an enabling flow of current through a circuit 32 to a charge changing circuit for a capacitor 34 to provide for a delayed reset of the flip-flop 22. The charge changing circuit includes a resistor 36, the resistance value of which determines how long it takes for the capacitor charge to change sufficiently to reset the flip-flop 22. Initially, the charge on capacitor is substantially 0, corresponding to a 0 logic state so as to maintain an inverter 38 in a logic 1 output state. The inverter 38 may be another NAND gate having both inputs connected to receive the logic 0 input. As the capacitor 34 charges up to a voltage value approaching the +V power supply voltage applied to transistor 28, the NAND gate 38 eventually sees two logic 1 inputs, causing that gate, operating as an inverter, to provide a logic 0 output. That output causes NAND gate 20 to shift again to a logic 1 output (since it again has one logic 0 input) causing NAND gate 18 to shift again to a logic 0 output, and thus causing NAND gate 20 to be locked into a logic 1 output state because of the logic 0 output cross-connected from logic gate 18 to one of the inputs of NAND gate 20. Thus, the flip-flop 22 is again reset to the first state, turning off the transistor gate 28, and restoring the circuit to its original condition. At that time, the accumulated charge on capacitor 34 is discharged through the diode 40 which is in shunt connection with the charge resistor 36, so that the capacitor is again discharged to its original state, and the inverter 38 is again shifted back to its logic 1 output state. Since diode 40 is poled only to permit discharge of capacitor 34 when connection 32 is at a voltage lower than that on capacitor 34, it does not interfere with the charging mode of operation of the capacitor charge circuit through resistor 36.

The capacitor 34 and resistor 36 are selected to preferably provide a time delay of about 15 seconds, so that a person using the weighing scale has about 15 seconds for the scale to stabilize in its reading, and to then read the scale, before the indicating system is de-energized.

The NAND gates 18, 20, and 38 may all be part of a single solid state circuit chip such as the COS/MOS chip having the product type designation CD 4011B and available from various manufacturers.

Figure 3:
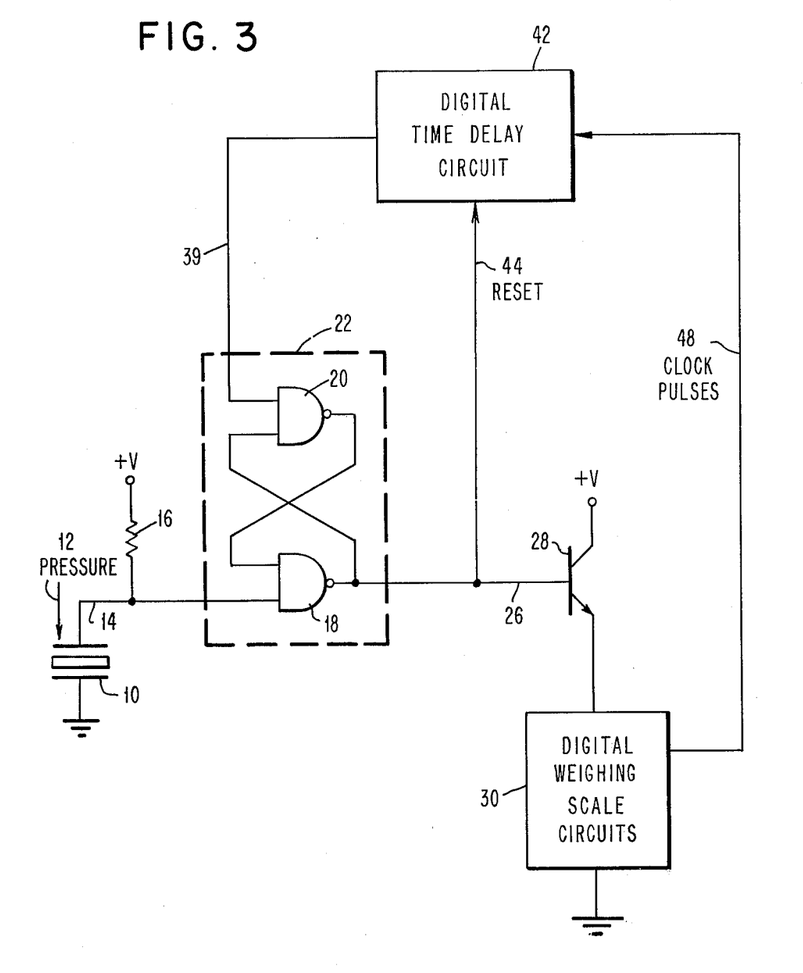
FIG. 3 is a schematic circuit diagram corresponding to FIG. 2, but illustrating an alternative embodiment of the circuit.

FIG. 3 illustrates an alternative embodiment of the circuit of FIG. 2 wherein a digital time delay circuit 42 is substituted for the resistor capacitor charge-changing circuit 34–36. In the circuit of FIG. 3, the digital time delay circuit 42 is maintained in a reset condition by a reset circuit indicated at 44 energized from the output connection 26 from NAND gate 18. Thus, as long as flip-flop 22 remains in the first state (without a pressure signal from piezoelectric device 10) the digital time delay circuit 42 remains reset. However, as soon as flip-flop 22 changes to the second state, the reset signal is removed, thus enabling the operation of the time delay circuit 42. Thus, the delay circuit commences operation. Clock pulses are provided through a connection 48 from the digital weighing scale circuits generally indicated at 30 to provide a time reference for the time delay circuit 42. Such clock pulses are normally available in the digital weighing scale circuits, which usually include light-emitting diodes, because the light-emitting diodes are multiplexed to reduce total power consumption. The digital time delay circuit may be a conventional digital counter which counts up or down for an interval determined by the number of counting stages and by the clock pulse frequency to eventually provide a logic zero output at connection 39 to one of the inputs to NAND gate 20 to thus reset flip-flop 22 to the first state, in a manner previously explained in connection with FIG. 2.

Figure 4:
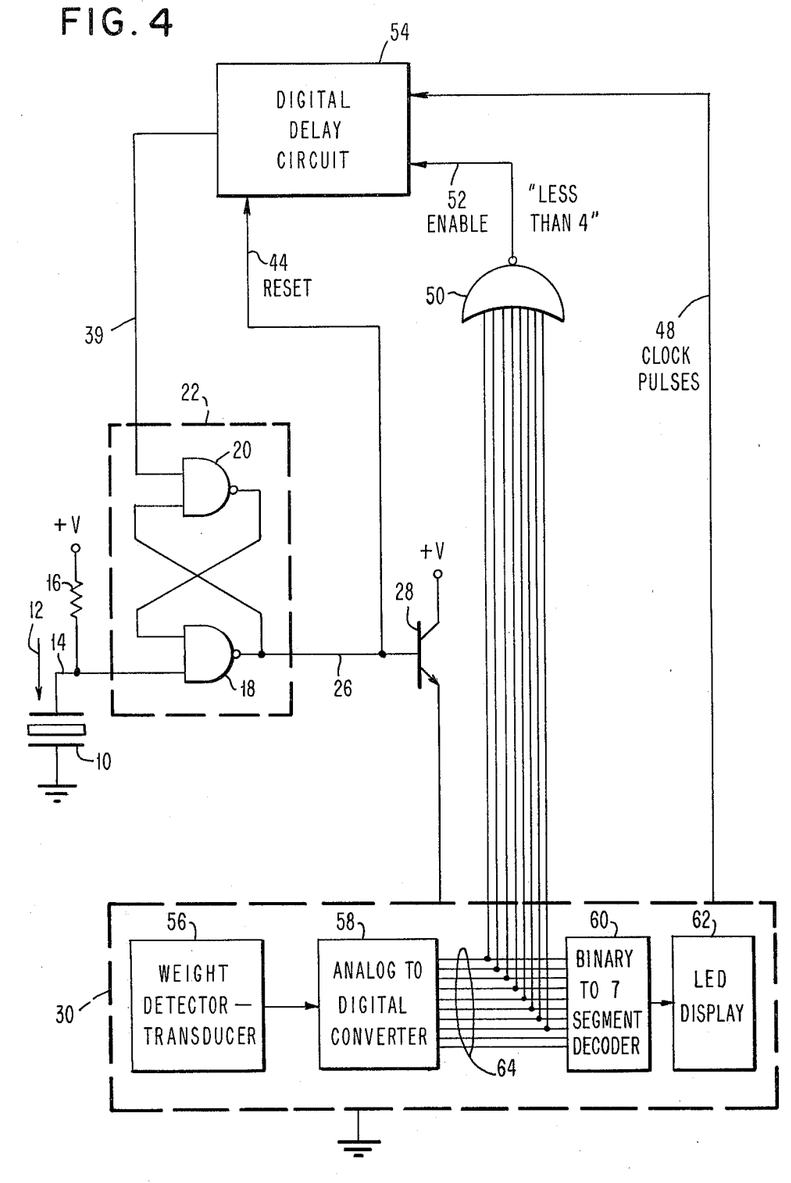
FIG. 4 is a schematic circuit diagram illustrating still another modification of the circuit of FIG. 2.

FIG. 4 is a further modification of the circuit of FIG. 2, which is very similar to FIG. 3 in many respects, except that the reset circuit is operable basically to reset the flip-flop 22 in response to a low measurement by the weighing scale circuits as the user removes the weight which is being weighed from the scale. The low scale reading is provided by a NOR circuit 50, which detects the condition when the scale measurement is "less than 4" to provide a logic 1 signal on a connection 52 as an "enable" signal to a digital delay circuit 54, and which then results in a reset signal on connection 39 when the delay circuit 54 times out. In this embodiment, the length of the delay provided by the delay circuit 54 can be quite short, say in the order of one second, since the only function of the delay is to prevent false operation of the reset circuit as the scale reading is increasing when the weight is originally placed upon the scale. Thus, the delay circuit only times out when the "less than 4" reading continues after the weight is removed from the scale. Thus, while the circuit of FIG. 4 appears to be somewhat more complicated than that of FIG. 3, the delay circuit 54 is much simpler than the delay circuit 42 of FIG. 3 because the delay interval is much shorter and it does provide for automatic turn-off of the scale indicator upon the removal of the weight.

To provide for a full understanding of the embodiment of FIG. 4, the digital weighing scale circuits 30 are shown in somewhat more detail, although still in schematic form. Thus, these circuits and elements are shown to include a weight detector-transducer 56, an analog-to-digital converter 58, a binary-to-seven segment decimal digital display decoder 60, and a light-emitting diode display 62. The weight detector-transducer 56 is operable to provide an analog weight-measurement signal to the analog-to-digital converter 58. The analog-to-digital converter provides output signals on the connections 64 which are in binary digital form, and which indicate the correct weight in terms of combinations of binary signals. No more than ten binary signals are required for this purpose which carry the conventional binary signal values "1, 2, 4, 8," etc. up to value "512".

The binary-to-seven segment decoder 60 then converts these signals for the energization of the light-emitting diode display 62.

The detection of a reading of the value "less than 4" from the digital outputs 64 is simply accomplished by the NOR gate 50 by connecting the NOR gate 50 inputs to all of the binary digital outputs 64 other than the outputs indicating the values "1" and "2". Thus, whenever any other digital value is present, either alone, or in combination with others of the digital values, the reading will be "4" or greater. Under those circumstances, at least one input will be available to the NOR gate 50, and the output will be a logic 0, so that an enable signal will not be available on connection 52. Thus, the delay circuit is disabled. However, if the reading is "less than 4", as evidenced by the absence of any of the inputs to NOR gate 50, then the output will be a logic 1 on connection 52 which will enable the digital delay circuit 54.

As in the embodiment of FIG. 3, a reset signal (logic "0") is available at connection 44 to reset the delay circuit when flip-flop 22 is in the first state because of the logic 0 signal on connection 26.

The operation of the circuit of FIG. 4 is as follows: the digital delay circuit 54 is reset and not enabled prior to the reception of a pressure signal 12 by the piezoelectric device 10 because flip-flop 22 is in its first state, providing a reset signal 44 from connection 26. When a weight is applied to the scale, the pressure signal 12 is received, and flip-flop 22 switches to its second state, removing the reset supplied through connection 44. Because of the initial reading on the weighing circuits of "less than 4", an effective enable signal may be supplied through NOR gate 50 on connection 52 to the delay circuit 54. However, as the indications of the weight measurement continue to rise to "4" and above, the operation of the NOR gate 50 removes the enable signal from delay circuit 54, thus disabling the circuit. However, when the weight is removed from the scale, the measured value decreases again to a value "less than 4", again starting the operation of the delay circuit 54 so that it times out, and provides a reset signal on connection 39 to the flip-flop 22, to again reset it to the first state. The resultant zero digital output at connection 26 then again resets the delay circuit 54 through connection 44, so that the entire circuit is again restored to its original condition.

The reason for using any value "less than 4" to turn off the circuit is to make sure that the circuit will operate, even though the scale calibration may be in a slight error condition so as not to register an exact "0" value.

The circuits of FIG. 4 are generally intended for use in a weighing scale for humans, for domestic use, of the kind commonly referred to as a "bathroom" scale. For such purposes, the lowest range of scale readings is not usually of interest. Accordingly, if desired, the NOR gate 50 may be wired to respond to the measurement of "less than 8" instead of "less than 4". In such a variation, the "4" input to NOR gate 50 is simply omitted.

As previously mentioned above, while the embodiment of FIG. 4 appears to be somewhat more complicated than the embodiment of FIG. 3, the digital delay circuit 54 may be substantially simpler than the delay circuit 42 of FIG. 3 because a much shorter time delay interval can be used. Also, the circuit of FIG. 4 has the advantage that the indicator circuit remains on until the weight is removed from the scale.

Figure 5:
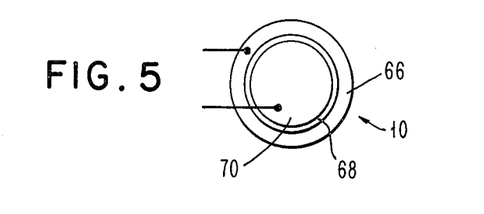
FIG. 5 is a top view of a piezoelectric device of a type which is useful in the practice of the invention.

A preferred piezoelectric element for use in the present invention is of the ceramic type. One preferred example of this type of piezoelectric element is in the form of a disc, as shown in FIG. 5. The disc may include a metal base 66 formed of half-hard brass and having a diameter of about 27 mm. Upon the metal base 66 there is attached the ceramic piezoelectric material 68 in a circle of lesser diameter (about 20 mm.). On the upper surface of the ceramic material 68 there is provided a thin film conductive layer 70. The layer 70 and the base 66 form the two electrodes for the piezoelectric element. The overall thickness of the device is only about 0.25 mm. Such a preferred device is commercially available as a tone transducer, Model 102, from the Piezo Products Division of Gulton Industries Inc. in Fullerton, Calif.

Figure 6:
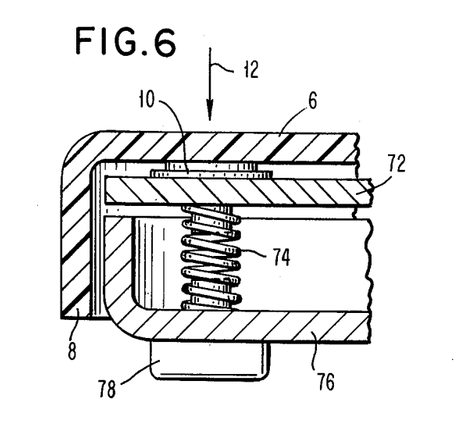
FIG. 6 is a partial sectional side view of a platform scale structure incorporating the piezoelectric device of FIG. 5 and illustrating how the mechanical pressure signal is applied to that device.
Figure 7:
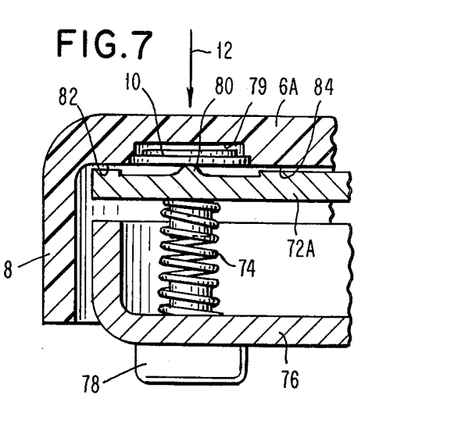
FIG. 7 is a partial sectional side view of a platform scale illustrating an alternative to the structure of FIG. 6 incorporating the piezoelectric device of FIG. 5 in which the device is mounted between the upper platform and the weight measurement receiving member beneath that platform in such a manner as to cause a slight deformation of the piezoelectric device under stress.
Figure 8:
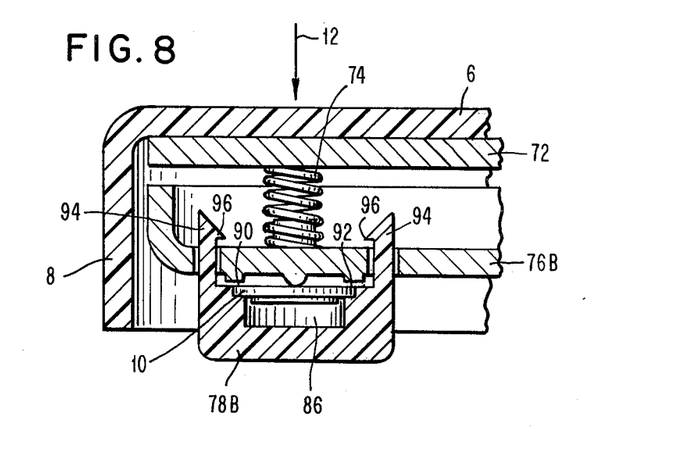
FIG. 8 is a partial sectional side view of a platform scale structure illustrating another alternative to the structure of FIG. 6 incorporating the piezoelectric device of FIG. 5, in which the piezoelectric device is incorporated in the structure of a support foot for the platform scale.

The piezoelectric element of FIG. 5 can be arranged in various ways to receive the mechanical signals, and several different arrangements are illustrated in FIGS. 6, 7, and 8. FIG. 6 is a partial sectional view of a platform scale illustrating a preferred arrangement for incorporating the piezoelectric element 10 of FIG. 5. The thickness of the piezoelement element 10 is exaggerated in FIG. 6 for purposes of clarity. Element 10 is positioned directly between the upper platform member 6, previously referred to in connection with FIG. 1, and a force transmitting member 72 to which the force of the weight to be measured is transmitted for measurement. A weight measurement mechanism (not shown) measures a summation of the mechanical forces applied to the platform 6 and transmitted to member 72, and to other corresponding members within the scale, typically through a spring system symbolized by spring 74 which is illustrated as supported upon a scale base member 76, which is in turn supported upon a foot member 78.

In this embodiment, at least one of the mutually facing surfaces (the under surface of platform member 6, and the upper surface of force-transmitting member 72) includes a substantially flat surface or face against which the piezoelectric element 10 is positioned so as to provide for full support of the piezoelectric element over its entire surface, and so that the piezoelectric element is not subjected to any substantial bending stress as it is subjected to pressure between the two members 6 and 72. Thus, the piezoelectric device 10 is subjected to pressure without bending, with an absolute minimum in deformation and virtually no deflection. Nevertheless, the piezoelectric device 10 is effective in response to pressure, and especially to a sudden change in pressure as a weight is placed on the platform, to provide a substantial electrical signal of the type illustrated in FIG. 2A which is effective to switch the state of flip-flop 22, as discussed above in connection with FIGS. 2, 3, and 4.

In order to maintain the desired position of the piezoelectric element 10 within the assembly of FIG. 6, the element may be cemented to the adjacent surface of either the member 6 or the member 72, or the piezoelectric element 10 may be molded into the under surface of the cover member 6. Cover member 6 is preferably composed of a synthetic resin.

FIG. 7 illustrates an alternative embodiment in which the cover member 6A is modified to provide a shallow cavity in the under surface thereof to receive the piezoelectric element 10, with a slight "relief" cavity 79 provided just above the piezoelectric element so that the element is supported only at the peripheral edges. Also, the force transmitting member 72 is modified as shown at 72A by the provision of a protrusion or nipple 80 which is positioned to engage the surface of the piezoelectric element on the side of the brass base member near the central portion thereof. When a weight force signal 12 is applied to the platform 6A, a very slight deformation of the piezoelectric element is caused by the mechanical force transmitted through the element from the peripheral edges of the disc which engage the cover member 6A to the nipple member 80. That deformation provides a very substantial signal of the kind illustrated in FIG. 2A. The deformation of the piezoelectric device is very slight, being of the same order of magnitude as the thickness of the device, and the deformation is limited by the provision of a very limited clearance between members 6A and 72A, as illustrated at 82 and 84. The deformation may be described as "in a dishing mode" since the device 10 is caused to "dish" slightly.

While the electrical signal from the piezoelectric element 10 is enhanced by the embodiment of FIG. 7, the embodiment of FIG. 6 is preferred because it requires virtually no deformation.

The principle embodied in FIG. 7 of providing for deformation of the piezoelectric element is carried out in a different manner in FIG. 8. In FIG. 8, the piezoelectric element 10 is incorporated into the foot 78B. Thus, the piezoelectric element is supported upon the peripheral edges within a cavity 86 within the foot 78B, the cavity providing "relief" in the central portion thereof. The bottom 76 of the scale casing is modified, as illustrated at 76B to include a central nipple element 88 in the bottom surface thereof to provide a slight deformation of the piezoelectric element 10 when the mechanical force signal 12 is applied. Again, the deformation travel of the piezoelectric element is strictly limited by stop members built into the bottom surface of the bottom plate 76B to provide limited travel clearance as illustrated at 90 and 92.

For ease of assembly, the foot 78B is preferably provided with bayonet-type fingers 94 which are insertable through suitable openings in the bottom plate 76B, and which include latching hooks 96 at the inner edges thereof to engage the inside surface of the base plate 76B to maintain the foot in the assembled position. While only two fingers 94 are illustrated, it will be understood that it is desirable to employ at least four of these fingers to adequately secure the foot 76B.

It will be appreciated that none of the embodiments of FIGS. 6 and 8 provide for any substantial deflection of the scale weighing mechanism in order to energize the switch apparatus. Also, since they are all arranged mechanically in series with the weighing mechanism, there is no impairment of the accuracy or calibration of the weighing mechanism by the presence and operation of the piezoelectric element 10. Furthermore, since the deformation and movement is virtually non-existent in FIG. 6, and imperceptible in FIGS. 7 and 8, there is no sensation of movement to the user on account of the operation of the piezoelectric switch apparatus.

While the piezoelectric device 10 and the associated circuit is continuously connected to the power supply, and thus causes a continuous stand-by current drain, such current drain is negligible (only a few microamperes). The piezoelectric device 10 itself appears to the circuit in the standby condition as a capacitor, with a very low capacitor leakage current. Furthermore, in the remainder of the circuit, only the flip-flop 22 is energized in the standby condition, absolutely minimizing the standby current drain. This is true of all three of the embodiments of FIGS. 2, 3, and 4.

The circuit components of the embodiments of FIGS. 2, 3, and 4 may be the conventional discrete components. However, particularly in the cases of FIGS. 3 and 4, the circuits may be incorporated as part of a custom integrated circuit which includes the various weighing scale circuits. Also the time delay functions of circuit 42 in FIG. 3 or circuit 54 in FIG. 4 may be fulfilled by means of a system sequence control (not shown) which is a part of the weighing scale circuits 30. The circuits of FIGS. 3 and 4 are essentially schematic in nature, and it will be understood that additional logic gates and interlocks may be incorporated to enhance operability, and to avoid unwanted back circuits.

One of the most important advantages of the present invention is that the switch apparatus is extremely fast. With a piezoelectric element of the type specifically described above, it has been found that the electrical signal oscillations such as illustrated in FIG. 2A are at a frequency which is high enough to result in a turnon of the piezoelectric switch apparatus in an interval of less than five milliseconds. This permits the taking of a zero reading from the transducers to provide automatic zero correction of the scale circuit almost instantaneously, as the weight to be weighed is placed upon the scale. The discovery of this zero correction advantage of the present invention forms the subject matter described and claimed in the copending related patent application of Harold Tomlinson previously referred to above.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. In an electronic digital weighing scale, apparatus comprising:
   an electrically energized weight indicating means including means providing a plurality of distinct signals indicating in combination the magnitude of a weight applied to the scale,
   a piezoelectric element positioned and arranged to receive a mechanical pressure signal and to generate in response thereto a weight indicating voltage signal when a weight is initially applied to the scale,
   a two-state circuit means having input means coupled to said piezoelectric element and output means coupled to said indicating means, the output of said two-state circuit operable from a first state deenergizing said indicating means to a second state energizing said indicating means upon initial receipt of a weight indicating signal from said piezoelectric element, and
   a time delay circuit coupled to said two-state circuit and said indicating means for causing said two-state circuit to switch from said second state to said first state after a predetermined delay period, said time delay circuit being responsive to said distinct signals of said indicating means such that the delay period runs only when said distinct signals indicate that the applied weight is less than a predetermined level greater than zero.

2. Apparatus as claimed in claim 1 wherein said time delay circuit comprises a digital delay circuit.

3. Apparatus as claimed in claim 1 wherein
   said scale is of the type having an upper platform member on which the weight to be measured is placed and
   a force-transmitting member beneath said platform member to which the force of the weight to be measured is transmitted for measurement,
   at least one of said last-mentioned members having a substantially flat face arranged opposite to the other one of said members,
   said piezoelectric element being a substantially flat element and being positioned against said flat face,
   and said piezoelectric element being arranged to receive pressure force transmitted between said members without substantial deformation of said piezoelectric element.

4. An apparatus as claimed in claim 1 wherein
   said piezoelectric element is a substantially flat circular element,
   and wherein said weighing scale includes a structure for enclosing and supporting said piezoelectric element to receive and respond to at least a part of the force of the weight to be measured by said scale,
   said support means including at least two elements,
   one of said elements engaging and supporting the peripheral edges of said piezoelectric element,
   and the other one of said elements engaging the central portion of said piezoelectric element to provide for a deformation of said piezoelectric element in a dishing mode in response to an actuating pressure signal to thereby generate the electrical voltage.

5. Apparatus as claimed in claim 4 wherein
   one of said pressure elements comprises a portion of the base of said weighing scale and the other one of said elements comprises a portion of a support foot for said base.

6. Apparatus as claimed in claim 4 wherein
   one of said pressure-applying elements comprises a part of an upper platform of said weighing scale positioned and arranged to receive the weight to be measured,
   and wherein the other one of said pressure-applying elements comprises at least a part of the weight force receiving and summing mechanism of said scale.

7. An apparatus as claimed in claim 1 wherein
said weighing scale includes at least one mechanical-to-electrical signal transducer for sensing a weight to be weighed mechanically and for providing an electrical signal output indicative of a sensed weight,
and weight registering circuits connected to said transducer and connected to said electrically energized indicating system,
said two-state circuit being connected and operable as a gating switch device to provide for the electrical energization of the electrical portion of said transducer and said weight registering circuits.

8. Apparatus as claimed in claim 7 wherein
said mechanical-to-electrical signal transducer comprises a metal substrate member having an electrical insulating material on one surface thereof with an electrical resistance element formed from a layer of a thick film resistor ink of the type used for thick film integrated circuits.

* * * * *